United States Patent

[11] 3,634,851

[72] Inventor George P. Klein
159 Robby Lane, Manasset Hills, N.Y. 11040

[21] Appl. No. 16,354
[22] Filed Mar. 4, 1970
[45] Patented Jan. 11, 1972

[54] SIGNAL CHARACTERISTIC MEASURING SYSTEM OF THE DIGITAL TYPE
10 Claims, 3 Drawing Figs.

[52] U.S. Cl. .......... 340/347 AD, 235/92 R, 235/92 CV
[51] Int. Cl. .......... H03k 13/02
[50] Field of Search .......... 348/347 AD; 235/92, 60, 53, 50; 328/34, 127, 178

[56] References Cited

UNITED STATES PATENTS

| | | | |
|---|---|---|---|
| 2,796,314 | 6/1957 | Bishop et al. | 340/347 X |
| 2,918,574 | 12/1959 | Gimpel et al. | 340/347 X |
| 2,761,968 | 9/1956 | Kuder | 340/347 X |
| 2,974,282 | 3/1961 | Scheftelowitz | 340/347 X |
| 3,247,487 | 4/1966 | Strong et al. | 340/347 X |
| 3,273,013 | 9/1966 | Shepard | 340/347 X |
| 3,408,595 | 10/1968 | Hillman | 340/347 X |

*Primary Examiner*—Thomas A. Robinson
*Assistant Examiner*—Joseph M. Thesz, Jr.
*Attorney*—Kenneth E. Merklen

ABSTRACT: The output of an oscillator drives a counter and a staircase signal generator, in synchronism. Interposed between the oscillator output and the staircase signal generator input is a uniform height pulse clipper which insures amplitude uniformity in the oscillator signal applied to the staircase signal generator. The staircase wave output and the signal to be interrogated are applied to a comparator which provides an output when a predetermined relationship, such as equality, between the two signals exists. The output of the comparator is applied to control logic which effectively interrupts advance of counter resulting in display of the count and resets both the counter and the staircase signal generator.

The uniform height pulses are applied to a novel staircase signal generator which includes two buffered ideal rectifiers connected back to back and two storage components. The staircase wave rises in increments synchronousely with the digital advance of the counter. Uniformity of each incremental rise of the staircase wave provides predeterminable value for each digital advance of the counter.

INVENTOR
GEORGE P. KLEIN
BY Kenneth E. Merklen
Attorney

INVENTOR
GEORGE P. KLEIN
BY
Kenneth E. Merklen
Attorney

SIGNAL CHARACTERISTIC MEASURING SYSTEM OF THE DIGITAL TYPE

The present invention relates to signal measuring systems of the digital type which determine and display the value of characteristics of an unknown signal by comparing such unknown signal to a generated, uniform-step staircase signal, the incremental step of which is positively related to the controlled advance of a counter. The readout of the counter displays the accumulated count after generation of an output from a signal comparator which compares the value of the generated uniform-step staircase signal and the value of the unknown signal and provides such output when a predetermined relationship between the value of the generated uniform-step staircase signal and the value of the unknown signal is sensed or determined by such comparator.

More particularly the present invention relates to an electric signal digital measuring system which generates a staircase signal having precisely controlled incremental step value. The staircase signal is incrementally increased in value, at a known rate and in absolute synchronism with the advance of a counter, such as a decade or digital counter, so that the value of the staircase signal is positively related to the condition of the counter. This relationship is assured by controlling the incremental advance of the staircase wave generator and the digital stepping of the counter by a common source, such as a common oscillator, the output signal of which controls both the staircase wave generator and the counter. The interrogated signal, the value of which is unknown, is applied to a comparator which also receives the staircase wave output of the staircase signal generator. The comparator compares the values of both input signals and provides an output when a predetermined relationship, such as equalization of signal values, for example, is detected or sensed. The output of the comparator may be applied to the counter to actuate the readout or display function of the counter thus visibly displaying the relation between the counter condition or accumulated count and the value of the staircase wave signal, which is positively related to the value of the unknown signal. The readout or display of the counter maybe calibrated in the characteristic interrogated such as voltage, for example.

The present novel signal measuring system may be used as a digital voltage measuring instrument and as such is substantially less complex than presently available digital voltage measuring instruments. This novel combination includes, in its preferred form, a staircase signal generator of novel construction, which although novel in itself is an integral part of the novel signal measuring system because of the fidelity of the staircase wave generated by the novel staircase signal generator.

An embodiment of the present novel signal measuring system may be used to measure any one of several characteristics of a signal, such as voltage or current, for example.

It is an object of the present invention to provide a signal measuring system of the digital type which employs a precision staircase wave signal for a standard against which an unknown signal is compared.

Another object is to provide a staircase wave generator, the output of which has sufficient fidelity to be used as a reference waveform in a signal measuring system of the digital type.

Another object is to provide a less complex signal measuring system of the digital type.

Another object is to provide a digital voltage measuring apparatus which employs a precision staircase wave signal which is incrementally stepped in positive relation to the incremental advance of a digital counter with provision for providing display of the condition of the counter when the value of the staircase wave signal reaches a predetermined relation to the value of a signal, the value of which is to be determined.

These and other objects will become apparent upon reading the following detailed disclosure with reference to the accompanying drawings in which.

Figure 1:
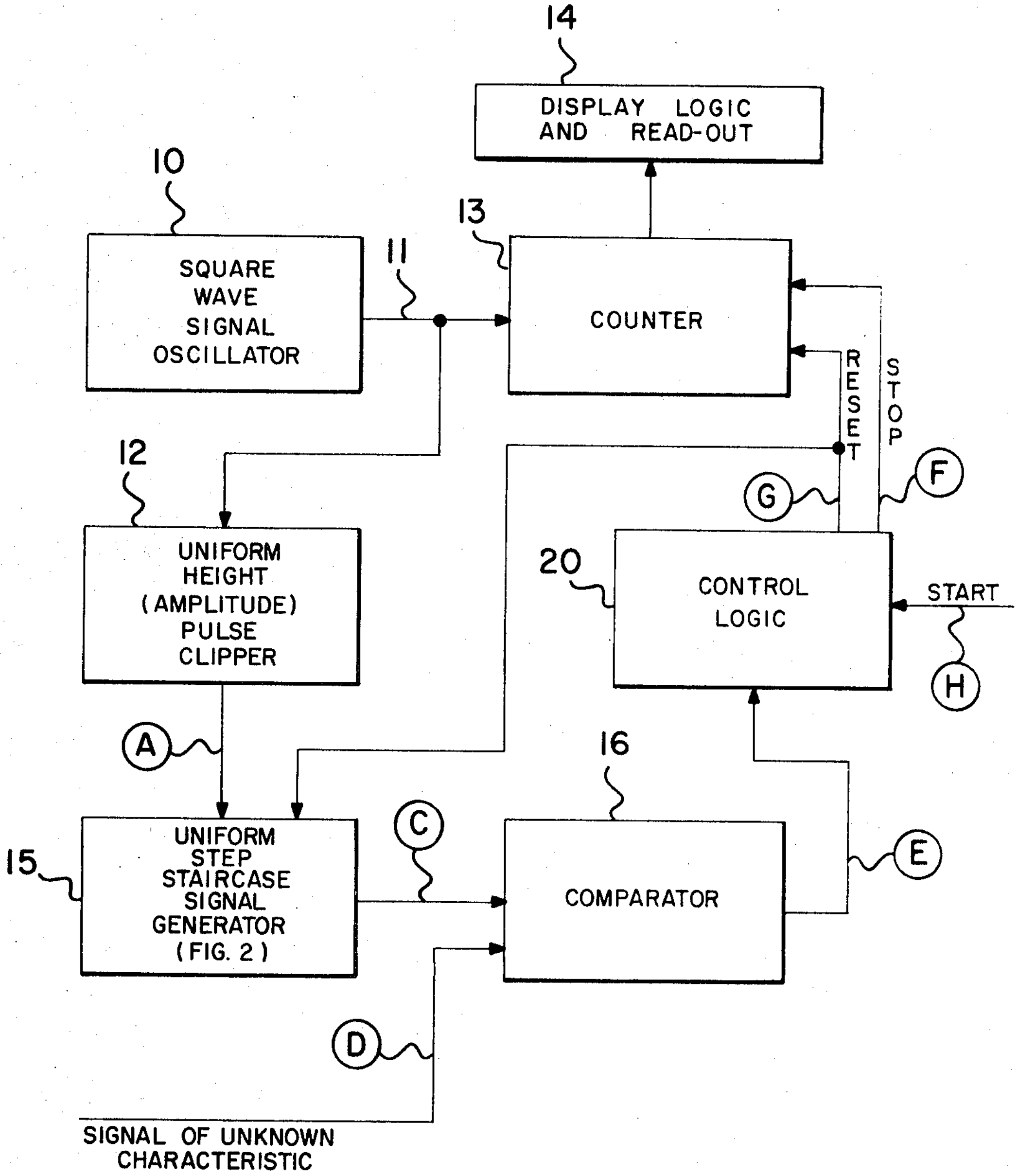
FIG. 1 is a block diagram of one embodiment of the present invention.

Referring to FIG. 1 in more detail, the block diagram here presented may be a digital voltage measuring instrument. The characteristic (i.e., voltage or current, for example) of the signal being measured maybe a function of the comparator. Assuming for the present purposes that the comparator is sensing the relation between the voltage value of the staircase wave and the voltage of the unknown signal then the apparatus represented by the block diagram represents a digital voltage measuring instrument.

Block 10, Square Signal Oscillator, represents an oscillator which provides an output signal having square wave characteristics at output 11. The squared wave oscillator signal is applied to block 12 and to block 13. The frequency of the signal output of block 10 is preferably such that the Counter, block 13 may respond with fidelity to a predetermined part or portion of each wave, as for example the leading edge of each wave input applied to the counter may advance the counter one increment or, the trailing edge of each wave input may accomplish the same function. Preferably the leading edge of the wave prepares or clears the counter for advance and the trailing edge advances the counter an incremental step, or part thereof, of the count.

The block 14, Display Logic and Readout, represents the visual display function of the counter. Block 12, Uniform Height (Amplitude) Pulse Clipper represents a pulse clipping circuit which ensures that the pulse height of the square wave oscillator signal input into block 15 is substantially uniform in amplitude. Such a circuit may be referred to as a "Level Standardizer Circuit."

Figure 2:
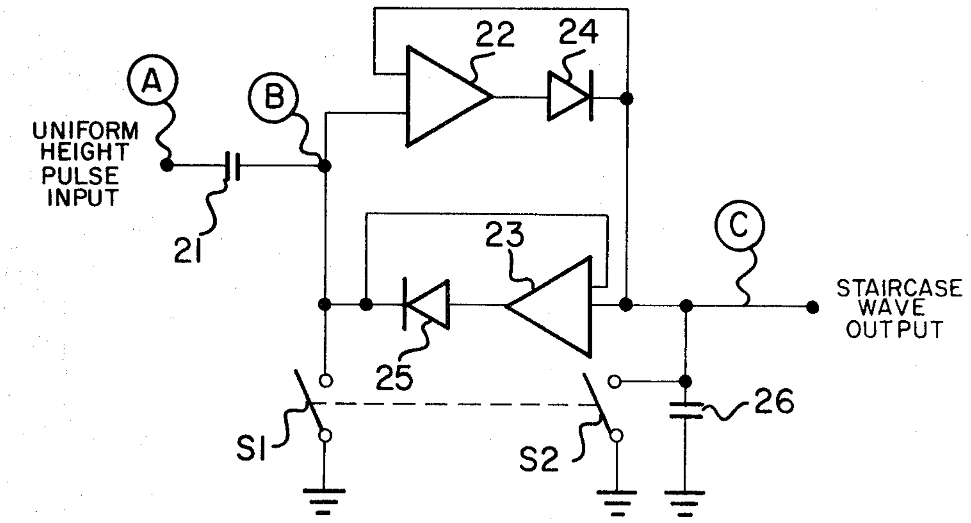
FIG. 2 is a diagram partly in block form and partly in schematic form of the novel staircase wave or signal generator employed in the preferred embodiment presented in FIG. 1
Figure 3:
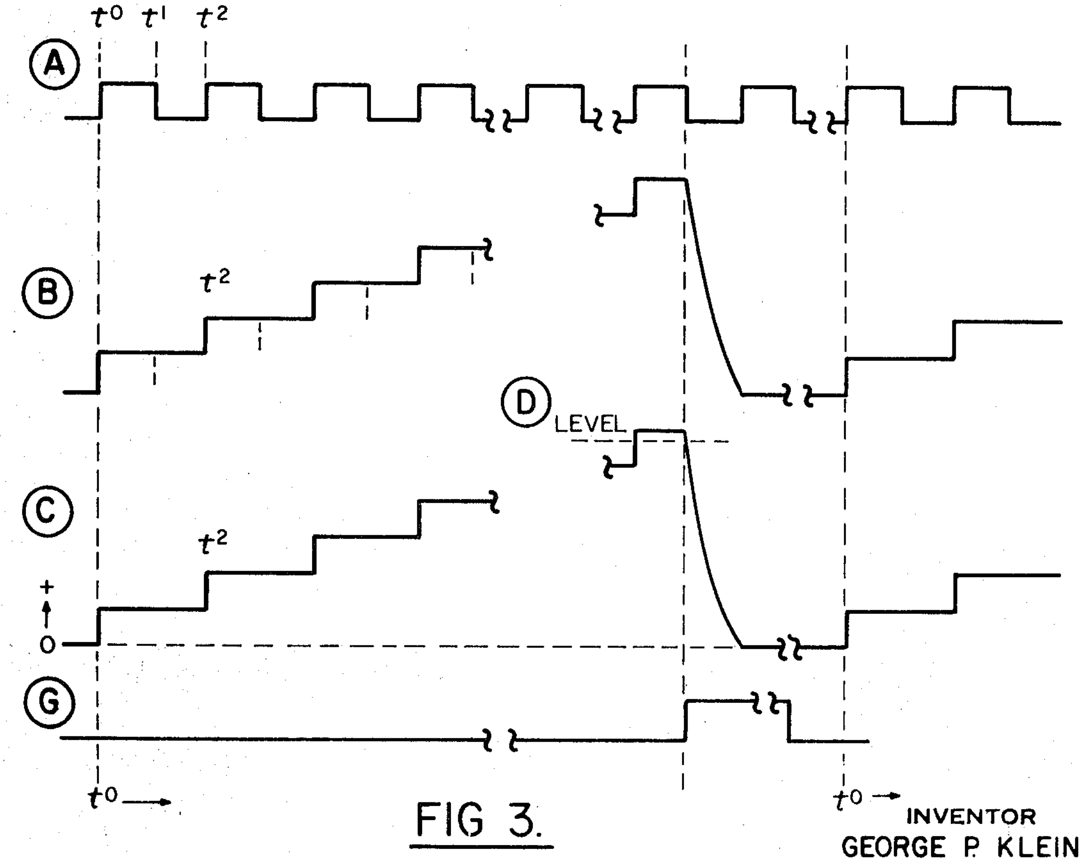
FIG. 3 is a series of waveforms referenced to the diagram of FIG. 2.

The signal A is applied to the Uniform-Step Staircase Signal Generator, block 15. A schematic-block diagram of such a circuit is represented in FIG. 2. The waveforms of the input signal A is represented in FIG. 3 and referenced to both FIGS. 1 and 2. The circuit form of block 15 will be discussed below.

The staircase wave or signal output of block 15 is represented in FIG. 2 at C. The wave is positively referenced to ground, for example and is incrementally advanced in amplitude a uniform, predetermined amount so that each rise of the staircase signal is uniform. Each uniform step of the staircase signal may therefore be related to the uniform incremental advance of the counter, each count of which represents the unit rise in amplitude of the staircase signal. In addition the amount of incremental rise of the wave C is directly related to the amplitude or height of the output pulse of the wave A.

It should be pointed out that the Uniform Height Pulse Clipper, block 12, may be made adjustable so that the amplitude or height of the pulses of the wave A may be changed. By changing the amplitude or height of the pulses of the output of the uniform height pulse clipper the incremental rise of the output signal C of the staircase signal generator is changed. This provides a unit conversion function since it may then require that the staircase signal generator take a larger or smaller number of steps to reach the same trigger amplitude. When the incremental rise of the wave C is changed (thereby changing the value of each incremental rise of the staircase wave) the value of each digital count of the counter is changed correspondingly. Thus, when the amplitude of the pulses of wave A is relatively small the incremental rise of wave C is corresponding small and a relatively large number of steps is required to reach a trigger amplitude, with the number of steps reflected by the relatively large count on the counter. When the amplitude of the pulses of wave A is changed and is made relatively large, for example, the incremental rise of wave C is correspondingly large and a smaller number of steps is required to reach the same trigger amplitude, with the number of steps reflected by the smaller count on the counter.

The output or count of the counter may be calibrated in any characteristic or physical unit depending on what the unknown signal D represents. For example although the voltage level of both the staircase wave C and the unknown signal D are compared, the signal D may represent pounds per square inch or revolutions per minute or any other physical unit. Thus the counter may be calibrated to reflect the value of the physical unit interrogated.

By virtue of the novel component combination of tHe staircase signal generator, component value changes, supply variations or changes in input timing have little or no effect on the uniform incremental rise of the output staircase. Thus, the operation of the present signal measuring system is virtually independent of component change, supply change or oscillator timing instability. This provides a signal measuring system that is substantially temperature, component, supply and/or frequency insensitive.

The staircase signal output C of the staircase generator is applied to a Comparator, block 16. The Comparator may be adjustable to provide an output comparison signal E on sensing a predetermined relationship between two signals, such as when signal C and signal D are substantially equal, or a predetermined ratio exists between the two signals. By adjusting the relationship basis between the two input signals C and D another unit conversion is provided.

Essentially the output signal E of the Comparator indicates that a predetermined relation exists between the input signal C, the value of which bears a predetermined relation with the condition of the counter, and signal D the value of which is being interrogated.

The output signal E is applied to block 20, Control Logic, which provides a stop signal F and a reset signal G. The stop signal F is applied to the Counter for functionally stopping the digital advance of the counter. According to the arrangement and sensitivity of the instrument the stop signal F may be applied to the counter to effectively electrically uncouple the counter from the square wave oscillator and to cause display or actuation of the Display Logic circuitry and the display of the accumulated count by the Readout block, 14. In another arrangement the stop signal F may permit one more count advance by the counter before electrically uncoupling the oscillator input signal 11, from the counter, and with such last digital advance of the counter, the readout may occur. Reset signal G is applied to the Counter to effectively reset the counter to its base count, such as zero, for example, and resets the Uniform-Step Staircase Generator so that the output signal C is driven to its base or reference level.

A start signal, H, may be used to initiate the operating cycle of the signal measuring instrument.

The frequency of the oscillator signal may be any reasonable frequency and would depend upon the speed of response of the components of the instrument.

Several factors to be considered is the speed of operation or response of the Comparator and the Counter. Rapid response to the various output signal, and in particular, signals F and G is preferred.

The cyclic operation of the instrument is preferably made short as compared to length of time the display or readout is held. This avoids readout or display flicker providing a more readable display.

Referring to FIG. 2, the preferred form of Uniform-Step Staircase Signal Generator includes: two storage elements 21 and 26 which receive, accumulate and store the input and output potential during generation of the staircase signal; two nonlinear devices with gain 22–24 and 23–25, the input impedance of each being high, relative to the storage elements, and two shorting elements S1 and S2 which restore the storage elements to the same reference such as zero, for example, for starting a new measuring cycle.

The input A to the staircase generator is a series of pulses, the amplitude of which are closely regulated. The period of occurrence and/or the duration of the pulses A need not be precisely controlled. The input signal A is applied to storage device 21, an input capacitor. Capacitor 21 passes the positive going portion of each pulse to storage device 26, which accumulates the potential for providing an output, C. The potential B follows the input transition incrementally in discrete steps. Coupled to the input capacitor 21 are two ideal rectifiers 22–24 and 23–25, connected back to back. Each ideal rectifier includes an ideal operational amplifier 22 and 23. The characteristics of the rectifiers 22–24 and 23–25 are such that in the forward direction there is no voltage drop across them and no current is drawn from the signal source. Conversely, when they are reverse biased no current flows through them. Essentially this type of rectifier is referred to as a "Buffered Ideal Rectifier."

Because of the characteristics of the buffered ideal rectifiers the output signal C follows the potential B.

With switches S1 and S2 closed (in response to the reset signal G) capacitors 21 and 26 become and remain at ground potential. Start signal H removes reset signal G releasing switches S1 and S2 so that each becomes open.

At time $t^o$ the positive excursion of the signal A charges input capacitor 21. The potential at B is passed on to output capacitor 26 via the buffered ideal rectifier circuit 22–24. At time $t^1$ the negative excusion of signal A drops the input signal to zero tending to pull the potential B along with the input side of capacitor 21. However, buffered ideal rectifier 23–25 holds the potential B at the level of the charge across the output capacitor 26. This has the effect of holding capacitor 21 charged to the value of output capacitor 26. At time $t^2$ the input signal A rises positively and the positive pulse is passed through input capacitor 21 to output capacitor 26 there by increasing the potential across capacitor 26 and therefore increasing the level of the output signal C. The incremental increase of the output signal C is made in response to each successive positive excursion of the input signal A, providing a true staircase signal.

When the output staircase wave C reaches the level of the signal D the comparator senses such condition and provides the comparator output signal E.

The size or value of the storage devices are noncritical since the operational amplifiers are ideal in characteristics. The closed loop gain of the "Buffered Ideal Rectifiers" is unity which can be very closely approximated with existing operational amplifiers. The input impedance and power gain of the "Buffered Ideal Rectifiers" are infinite, or practically such. Because of these characteristics the voltage or charge across the capacitor 26 will not appreciably change in between the positive and negative excursions of the input pulses. In addition, the frequency of the input pulse and duty cycle have no effect on the size of the rise of the staircase wave output C. Further, the output wave C is substantially independent of the rise times of the input pulses A. It will be noted however, that the amplitude of the pulses of signal A determines the rise of staircase wave output C. Therefore it may be desirable to provide a uniform height pulse clipper which is adjustable with respect to the amplitude of the pulses of the input signal A. This may serve to provide a unit conversion feature.

Since the incremental rise of the staircase wave C is in synchronism with the digital advance of the counter and since the successive incremental rises are uniform, each digital advance of the counter represents the value of such rise. Thus, when the amount of incremental rise of the staircase wave is changed the value of each digital unit of the accumulated count is changed.

The digital value of the voltage and/or current of the signal D may be quickly and accurately measured and displayed.

Thus I have shown and described a novel signal measuring system of the digital type and I have described several modification and/or changes that may be included in some of the components in the system. Other modifications and/or changes may be made as will be familiar to those skilled in the art without departing from the spirit of the invention.

What I claimed is:

1. A signal measuring system for determining the value of an unknown signal and for displaying the digital value of such signal, said signal measuring system including:

an oscillator for generating an output signal having square wave characteristics, a digital counter adapted to be driven by said output signal of said oscillator for providing an accumulated count, said counter including a display logic and readout component, a staircase signal generator adapted to be driven by said output signal of said oscillator for providing a uniform incremental rise staircase signal output, said digital counter and said staircase signal generator driven in synchronism by said output signal of said oscillator, a comparator for comparing the value of the staircase signal output with the value of the unknown signal, and for providing a comparison signal output when the value of the staircase signal and the value of the unknown signal are in predetermined relation, logic means responsive to said comparison signal output for effecting cessation of the drive of said counter by said output signal of said oscillator and for actuating said display logic and readout component for displaying the accumulated count of the said counter and said logic means further providing a signal in response to said comparison signal output for resetting said counter and said staircase signal generator to predetermined relationship.

2. A signal measuring system as in claim 1 and further including:

a uniform height pulse clipper interposed between said oscillator and said staircase generator for ensuring that each pulse of said output signal of said oscillator is uniform in amplitude.

3. A signal measuring system as in claim 1 and in which said staircase generator includes:

an input capacitor, an output capacitor, first and second ideal buffered rectifiers connected back to back in parallel relation between said input capacitor and said output capacitor each said ideal buffered rectifier including a series-connected amplifier and rectifier, the said input capacitor coupled in parallel to the amplifier of said first ideal buffered rectifier and to the rectifier of said second ideal buffered rectifier and said output capacitor coupled in parallel to the amplifier of said second ideal rectifier and to the rectifier of said first ideal buffered rectifier.

4. A signal measuring system as in claim 1 and in which the characteristic so compared by said comparator is voltage.

5. A signal measuring system as in claim 1 and in which the characteristic so compared by said comparator is current.

6. A signal measuring system as in claim 1 and in which the unit advance of said counter is driven in synchronism with the incremental rise of said staircase signal output and said means responsive to said comparison signal further includes:

reset means for resetting said counter and said staircase signal to a relative base value.

7. A signal value measuring system of the digital type including:

a counter including a digital readout, said counter adapted to be advanced digitally in count in response to the individual pulses of an oscillator output signal, and to accumulate said count and display said accumulated count, a staircase wave generator for providing a staircase output incrementally advanced uniformly in value in response to the individual pulses of an oscillator output signal, an oscillator for generating said oscillator output signal, said signal applied to said counter and to said staircase wave generator for driving said counter and said staircase wave generator synchronously, a signal comparator for comparing the value of an unknown signal input with the value of said staircase output and providing a comparison output signal when the value of the unknown signal and the value of the staircase output are equal, and logic means for receiving said comparison output signal and for providing a first signal in response thereto for interrupting advance of said count and for effecting display of the accumulated count and for providing a second signal in response to said comparison output signal for resetting said counter and said staircase wave generator synchronously to base values respectively.

8. A signal value measuring system of the digital type as in claim 7 and further including:

pulse clipper means interposed between said oscillator and said staircase wave generator for clipping the pulses of said oscillator output signal so that said pulses are uniform in amplitude and for applying said oscillator output signal of uniform pulse amplitude to said staircase wave generator.

9. The method of measuring the value of an unknown signal by comparing the unknown signal to a staircase signal the value of which is accumulated in conjunction with the advance of a counter including the steps of:

generating a signal having square wave characteristics, driving a digital counter with successive pulses of the square wave signal to advance the counter digitally, clipping the pulses of the square wave signal so that the amplitude of each successive pulse is uniform, driving the staircase signal generator with the uniform amplitude pulses so that the rise of the staircase signal and the advance of the digital counter are in synchronism, comparing the unknown signal with the staircase signal and providing an output when the value of the staircase signal equals the value of the unknown signal, discontinuing the digital advance of the counter when the value of the staircase signal equals the value of the unknown signal, displaying the accumulated count on the counter and resetting the staircase signal generator and the digital counter synchronously to relative base values.

10. A signal measuring system for determining the digital value of a characteristic of an unknown signal, said signal measuring system including:

means for generating a signal having square wave characteristics, digital counter means adapted to be digitally advanced in count in response to a predetermined number of square wave pulses of said signal being applied to said counter and for accumulating said count upon being advanced, staircase wave generator adapted to rise in value a predetermined amount in response to said predetermined number of pulses of said square wave signal being applied to said staircase wave generator and for accumulating the value of said staircase wave, a signal characteristic comparator for comparing a predetermined characteristic of said unknown signal with said predetermined characteristic of said staircase wave and for providing an output when said comparator senses a predetermined relation between the value of the said characteristic of said unknown signal and the value of the said characteristic of said staircase wave, said digital counter adapted to display the accumulated said count in response to said output of said comparator and means responsive to said output of said comparator for resetting said digital counter and said staircase wave generator to base values respectively.

* * * * *